(12) United States Patent
Liu et al.

(10) Patent No.: US 8,735,994 B2
(45) Date of Patent: May 27, 2014

(54) ELECTRICAL-FREE DUMMY GATE

(75) Inventors: Chia-Chu Liu, Hsinchu (TW); Kuei Shun Chen, Hsin-Chu (TW); Chiang Mu-Chi, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 120 days.

(21) Appl. No.: 13/431,072

(22) Filed: Mar. 27, 2012

(65) Prior Publication Data
US 2013/0256809 A1 Oct. 3, 2013

(51) Int. Cl.
*H01L 27/088* (2006.01)
(52) U.S. Cl.
USPC .......................................... 257/401
(58) Field of Classification Search
CPC ............ H01L 29/66545; H01L 27/088; H01L 27/092; H01L 21/8238; H01L 29/772; H01L 27/105; H01L 29/66651; H01L 29/66666; H01L 29/732; H01L 29/7395; H01L 29/94; H01L 21/823842; H01L 27/11519; H01L 27/11565; H03K 17/687
USPC .......................... 257/213–413, 900, 902–903, 257/E21.19–E21.21, E21.394–E21.458, 257/E21.615–E21.694, 151–153, 257/E29.125–E21.131, E29.134–E29.138, 257/E29.14–E29.161, E21.41, E29.275, 257/E29.319, E27.06, E29.242, E21.546; 438/268, 591, 199, 283, 157, 135, 142, 438/183, 926
See application file for complete search history.

(56) References Cited

U.S. PATENT DOCUMENTS

| | | | | |
|---|---|---|---|---|
| 7,759,182 B2* | 7/2010 | Fleck et al. | ..................... | 438/183 |
| 8,120,086 B2* | 2/2012 | Law et al. | ..................... | 257/307 |
| 8,319,257 B2* | 11/2012 | Hayashi et al. | ............... | 257/202 |
| 2007/0111405 A1* | 5/2007 | Watanabe et al. | ............. | 438/142 |
| 2007/0145519 A1* | 6/2007 | Peng et al. | ..................... | 257/506 |
| 2008/0283871 A1* | 11/2008 | Hamada | ......................... | 257/204 |
| 2009/0085067 A1* | 4/2009 | Hayashi et al. | ............... | 257/202 |
| 2009/0087754 A1* | 4/2009 | Aton | ................................... | 430/5 |
| 2009/0172611 A1* | 7/2009 | Tanaka | ............................. | 716/4 |
| 2011/0227188 A1* | 9/2011 | Wang et al. | .................. | 257/499 |
| 2012/0119301 A1* | 5/2012 | Choi et al. | ..................... | 257/369 |
| 2012/0292666 A1* | 11/2012 | Tamaru | ...................... | 257/202 |
| 2013/0140641 A1* | 6/2013 | Chuang et al. | ................ | 257/369 |
| 2013/0175589 A1* | 7/2013 | Chen | ............................. | 257/296 |

* cited by examiner

*Primary Examiner* — Dao H Nguyen
*Assistant Examiner* — Tram H Nguyen
(74) *Attorney, Agent, or Firm* — Haynes and Boone, LLP

(57) ABSTRACT

The present disclosure provides a semiconductor device. The semiconductor device includes an electrical-free dummy gate formed over a substrate. The dummy gate has an elongate shape and is oriented along a first direction. The semiconductor device includes a first functional gate formed over the substrate. The first functional gate has an elongate shape and is oriented along the first direction. The first functional gate is separated from the dummy gate in a second direction perpendicular to the first direction. A first conductive contact is formed on the first functional gate. The semiconductor device includes a second functional gate formed over the substrate. The second functional gate has an elongate shape and is oriented along the first direction. The second functional gate is aligned with and physically separated from the dummy gate in the first direction. A second conductive contact is formed on the second functional gate.

19 Claims, 3 Drawing Sheets

ELECTRICAL-FREE DUMMY GATE

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

The scaling down process may lead to fabrication challenges. For example, in certain semiconductor applications, a dummy gate may be formed adjacent to a functional gate. As the semiconductor features continue to get scaled down, the distance between the dummy gate and the functional gate is reduced. Therefore, an electrical voltage applied to the dummy gate may create a leakage path through a gate oxide insulator to the adjacent functional gate, which can cause damage to the functional gate.

Therefore, while existing methods of forming functional gates and dummy gates have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
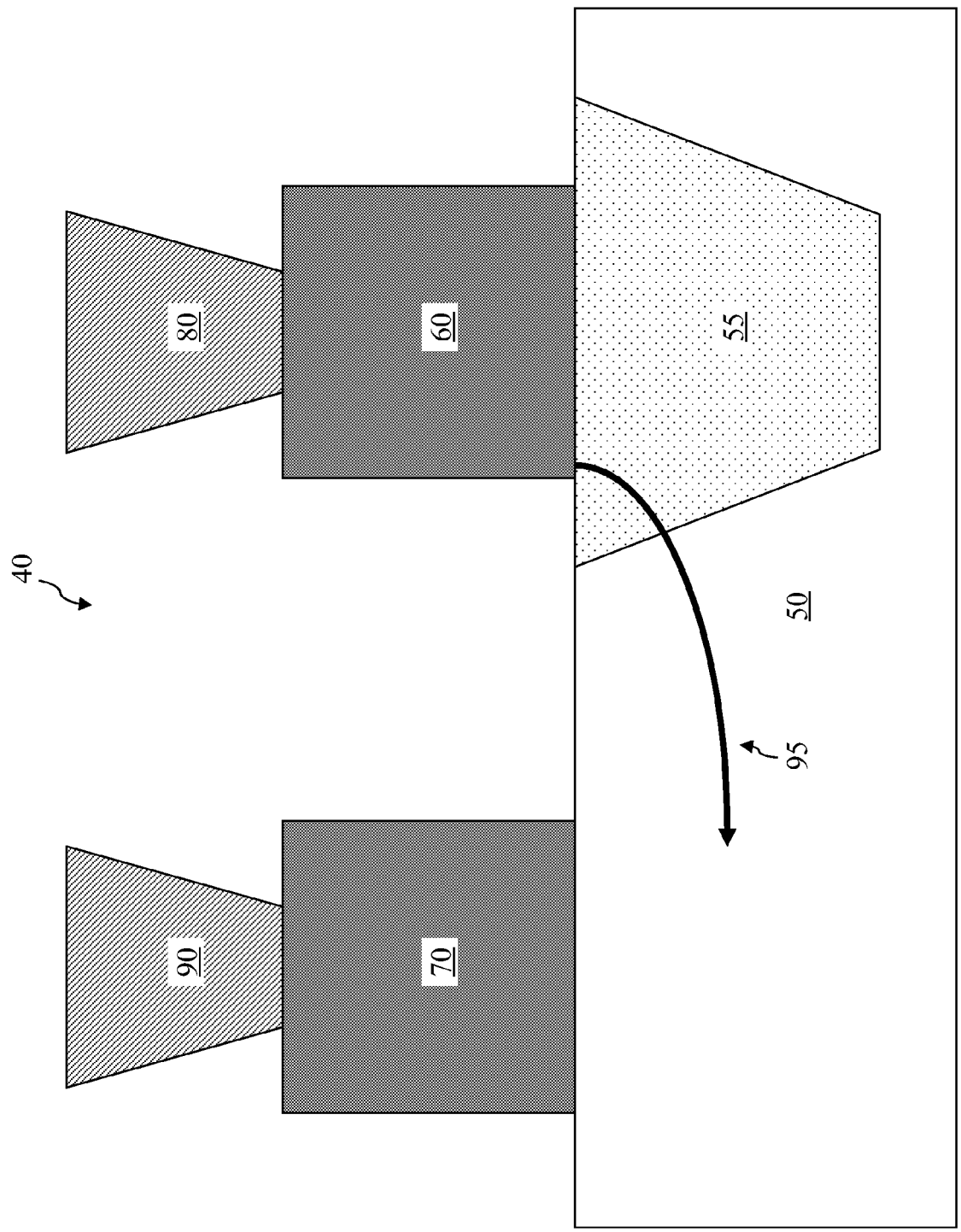
FIG. 1 is a cross-sectional view of a semiconductor device having a dummy gate formed adjacent to a non-dummy functional gate.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As semiconductor devices continue to get scaled down, various problems may arise. One of these problems involves device breakdown or leakage. This may occur when a dummy gate is formed adjacent to a non-dummy gate. An electrical voltage applied to the dummy gate may affect the adjacent non-dummy gate in an undesirable manner. To illustrate this issue, refer to FIG. 1, which is a simplified diagrammatic fragmentary cross-sectional side view of a portion of a semiconductor device 40. The semiconductor device 40 includes a substrate 50 that contains a dielectric isolation structure 55. A dummy gate 60 and a non-dummy gate 70 (also referred to as a functional gate) are formed on the substrate 50. The dummy gate 60 is formed over the dielectric isolation structure 55. An electrical contact 80 is formed on the dummy gate 60, and an electrical contact 90 is formed on the non-dummy gate 70.

Since the semiconductor device 40 has been scaled down, the distance between the dummy gate 60 and the non-dummy gate 70 may be quite small. A gate oxide portion of the dummy gate 60 is also a weak point from a processing perspective, especially as the device scaling down process leads to a thinner gate oxide. As a result, when an electrical voltage is applied to the gate 60 (for example, through the electrical contact 80), a breakdown path 100 may be formed through the gate oxide portion and between the dummy gate 60 and the non-dummy 70. As the scaling down process continues, the distance between the gates 60 and 70 becomes smaller and smaller, and thus the breakdown path 95 is more likely to be formed, and when it is formed, it may cause damage (or otherwise degrade device performance) to the transistor of which the gate 70 is a component.

According to the various aspects of the present disclosure, an electrical-free dummy gate is formed to prevent the forming of the breakdown path discussed above. The electrical dummy gate reduces the likelihood of damage to the functional gate next to the dummy gate.

Figure 2:
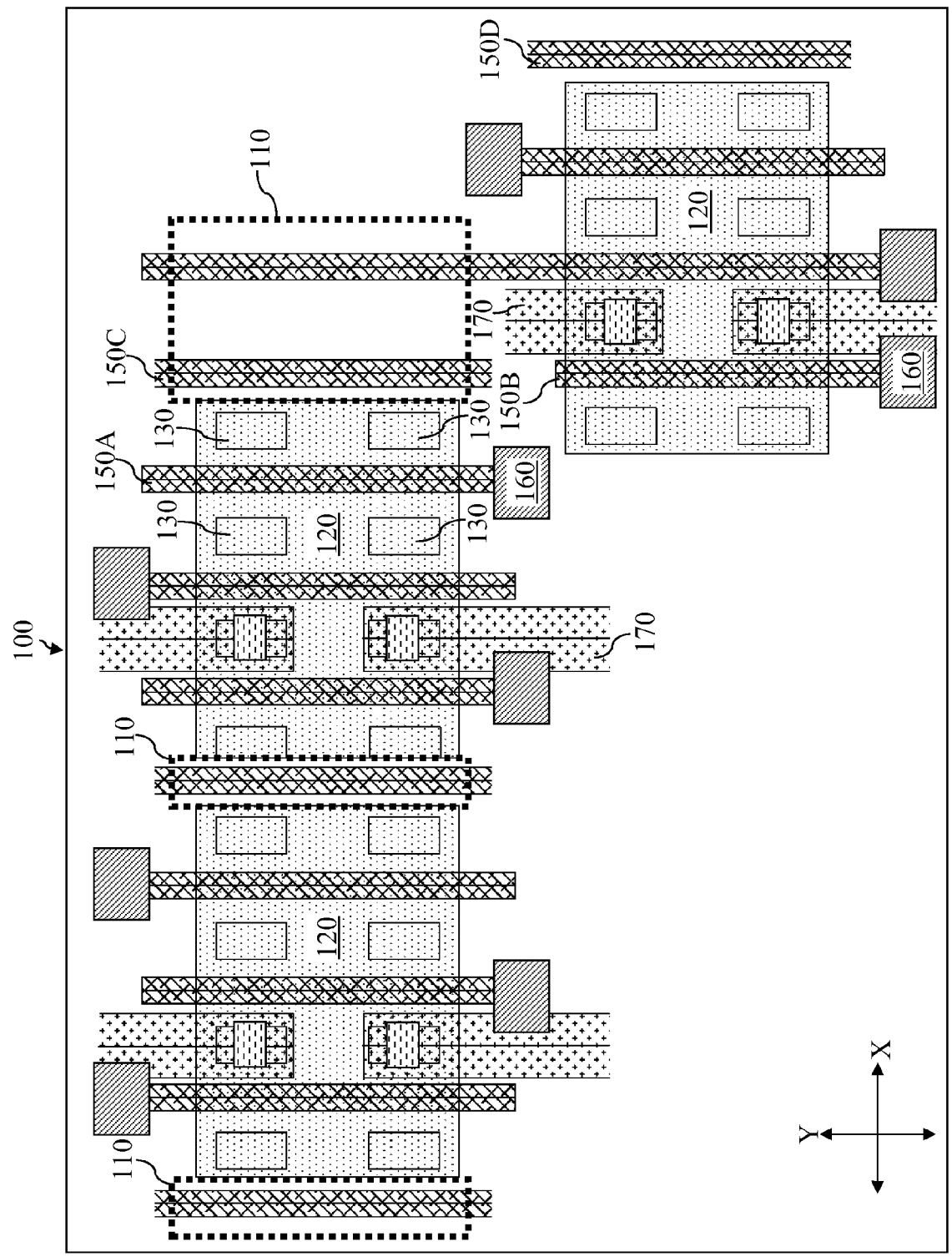
FIG. 2 is a diagrammatic fragmentary top view of a semiconductor device in accordance with various aspects of the present disclosure.

Referring now to FIG. 2, a diagrammatic fragmentary top view of a semiconductor device 100 is illustrated. The semiconductor device 100 may be a semiconductor Integrated Circuit (IC) chip, system on chip (SoC), or portion thereof, that may include memory circuits, logic circuits, high frequency circuits, image sensors, and various passive and active components such as resistors, capacitors, and inductors, P-channel field effect transistors (pFET), N-channel FET (nFET), metal-oxide semiconductor field effect transistors (MOSFET), or complementary metal-oxide semiconductor (CMOS) transistors, bipolar junction transistors (BJT), laterally diffused MOS (LDMOS) transistors, high power MOS transistors, or other types of transistors. It should be noted that some features of the semiconductor device 100 may be fabricated with a CMOS process flow.

The semiconductor device 100 is formed on a substrate. For example, the substrate may be a silicon substrate that is doped with a P-type dopant such as boron. As another example, the substrate may be a silicon substrate that is doped with an N-type dopant such as arsenic or phosphorous. The substrate may alternatively be made of some other suitable elementary semiconductor material, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Further, in some embodiments, the substrate could include an epitaxial layer (epi layer), may be strained for performance enhancement, and may include a silicon-on-insulator (SOI) structure.

Isolation structures 110 are formed in the substrate 50. In some embodiments, the isolation structures 110 include shallow trench isolation (STI) features. The STI features contain a dielectric material, which may be silicon oxide, silicon nitride, silicon oxy-nitride, fluoride-doped silicate (FSG), and/or a low-k dielectric material known in the art. The STI features are formed by etching trenches in the substrate and thereafter filling the trenches with the dielectric material. In other embodiments, deep trench isolation (DTI) features may also be formed in place of (or in combination with) the STI features as the isolation structures.

A plurality of microelectronic components is also formed in the substrate 50. For example, an active region 120 containing doped wells may be formed in the substrate by one or more ion implantation and/or diffusion processes. Source and drain regions 130 of FET transistor devices may be formed in the active region 120. The source and drain regions 130 may also be formed by various ion implantation and/or diffusion processes.

A plurality of gate structures (or gate lines) 150 are formed over the substrate. In the embodiment shown, the gate structures 150 are oriented in an X-direction. In other words, the gate structures 150 have elongate shapes and are each extending along an X-axis. The gate structures may be formed by a plurality of deposition processes and a plurality of patterning processes. For example, the deposition processes may involve physical vapor deposition (PVD), chemical vapor deposition (CVD), sputtering, plating, or combinations thereof. The patterning processes may involve lithography processes, which may contain one or more exposing, baking, developing, rinsing, and etching steps (though not necessarily in that order).

The resulting gate structures 150 may contain gate dielectric components and gate electrode components. The gate dielectric components may be high-k dielectric components, which contain a high-k material having a dielectric constant that is greater than a dielectric constant of $SiO_2$ (wherein the dielectric constant of $SiO_2$ is approximately 4). In some embodiments, the high-k material includes hafnium oxide ($HfO_2$), which has a dielectric constant that is in a range from approximately 18 to approximately 40. As other examples, the high-k materials may include one of $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, and SrTiO. Alternatively, the gate dielectric components may be non-high-k dielectric components, for example a gate dielectric component that contains silicon oxide.

The gate electrode components may be metal gate electrode components or polysilicon gate electrode components. For metal gate electrode components, they may each include a work function metal layer, a blocking layer, and a fill metal layer. The work function metal layer is designed and configured to help tune a work function of the gate, such that a desired threshold voltage may be achieved for the respective transistor. For example, for a PMOS transistor, the work function metal layer may contain titanium nitride (TiN), tungsten (W), tungsten nitride (WN), or tungsten aluminum (WAl). The fill metal layer is configured to serve as the main conductive portion of the gate electrode. In some embodiments, the fill metal layer may contain aluminum (Al) or titanium (Ti). The fill metal layer may alternatively contain other conductive materials such as tungsten (W), copper (Cu), or combinations thereof. The blocking layer is configured to block or reduce diffusion between the work function metal layer and the fill metal layer. In some embodiments, the blocking layer includes TiN or tantalum nitride (TaN). In other embodiments, a wetting layer may be formed between the blocking layer and the fill metal layer. For polysilicon gate electrode components, the gate electrode contains a polysilicon material.

A subset of the gate structures 150 are functional non-dummy gate structures. The functional gate structures 150 are parts of FET transistor devices. The functional gate structures 150 are formed over the active region 120. In various embodiments, each functional gate structure 150 is located between two source/drain regions 130 from a top view. Stated differently, a source/drain region 130 is formed on one side of the function gate structure 150A in a Y-direction, and another source/drain region 130 is formed on an opposite side of the functional gate structure 150 in the Y-direction. The X-direction and the Y-direction are perpendicular to each other. It is understood, however, that the source/drain regions 130 are not co-planar with the functional gate structures 150 in a cross-sectional side view. Rather, the source/drain regions 130 would be located below the functional gate structures 150 in the cross-sectional view.

To establish electrical access to the functional gate structures 150, an electrical contact 160 is formed on each of the functional gate structures 150. The electrical contact 160 contains a conductive material, for example a metal material. The electrical contact 160 allows the functional gate structures 150 to be electrically coupled to other devices, such as interconnect lines in an interconnect layer formed above the gate structures 150. For purposes of providing an example and to facilitate the ensuing discussions, two of such functional gate structures are illustrated herein and designated with the reference numerals 150A and 150B.

Another subset of the gate structures 150 are dummy gate structures. For purposes of providing an example and to facilitate the ensuing discussions, two of such dummy gate structures are illustrated herein and designated with the reference numerals 150C and 150D. In various embodiments, the dummy gate structures 150C-150D are formed over the dielectric isolation structures 110. The dummy gate structures 150C-150D may be formed for a variety of reasons. For example, the dummy gate structures 150C-150D may be formed to improve process uniformity or to reduce a loading effect. In some embodiments, the gates 150A-150C are formed in the same fabrication process. In alternative embodiments, the gates 150A-150C are formed in separate fabrication processes.

The dummy gate structures 150C-150D are formed to be electrical-free devices according to the various aspects of the present disclosure. For example, the dummy gate structure 150C is separated or spaced part in the X-direction from the functional gate structure 150A. In the embodiment shown in FIG. 2, a portion of the active region 120 is disposed between the dummy gate structure 150C and the functional gate structure 150A (as seen from the top view). Some source/drain regions 130 are also disposed between the dummy gate structure 150C and the functional gate structure 150A in the embodiment shown in FIG. 2.

The dummy gate structure 150C is also separated or spaced part in the Y-direction from the functional gate structure 150B. The dummy gate structure 150C is also aligned in the Y-direction with the functional gate structure 150B. In the embodiment shown in FIG. 2, a portion of the isolation structure 110 is disposed between the dummy gate structure 150C and the functional gate structure 150B (as seen from a top view). In addition, to ensure that the dummy gate structure 150C-150D are electrical-free, no electrical contacts are formed on the dummy gate structures 150C-150D. The dummy gate structures 150C-150D are also not in physical contact with any other components of the semiconductor device 100 that can be electrically-charged.

For these reasons discussed above, the dummy gate structures 150C-150D are electrical-free, and no electrical voltage is applied to them. Consequently, when the semiconductor device 100 is in operation, there is substantially no risk of inducing a breakdown path between the dummy gate structure 150C and the functional gate structure 150A, since the dummy gate structure 150C is formed to be electrically-free. Therefore, damage or degradation to the semiconductor device 100 is prevented.

In comparison, for conventional semiconductor devices, a dummy gate structure like the gate structure 150C of FIG. 2 may be formed along with a functional gate structure like the gate structure 150B as a single gate structure. In other words, the dummy gate structure 150C and the functional gate structure 150B would have been electrically joined together, though the functional gate portion 150B is configured for electrical access, whereas the other portion 150C is configured as a dummy component. Consequently, an electrical voltage applied to the functional portion would have been passed on to the dummy portion as well. If the dummy portion is located adjacent to another functional gate structure like the functional gate structure 150A, then the small distance between the dummy portion and that adjacent functional gate structure will likely induce a breakdown path, thereby causing damage to the conventional semiconductor device.

The present disclosure obviates the issues associated with conventional devices by physically (and thus electrically) separating the dummy gate structure from the function gate structure. The separation may be achieved during a design or layout stage, where the design and layout engineers can make a conscientious effort to "cut" a dummy gate like the dummy gate structure 150C from a functional gate structure like the functional gate structure 150B. Therefore, when a photo mask is produced according to such layout design, the dummy gate structure 150C can be made to be electrically isolated from other gate structures, so that it will not experience any electrical voltage.

On the other hand, if the design and layout engineers had not generated a layout design where the dummy gate structure 150C is separated from the functional gate structure 150B, the separation between the dummy gate structure 150C and the functional gate structure 150B may be achieved during actual semiconductor fabrication. For example, an etching process may be utilized to "break" the dummy gate structure 150C apart from the functional gate structure 150B.

In some cases, an existing layout design may have initially placed an electrical contact on a dummy gate structure (or a dummy portion of a gate structure containing both a dummy gate and a functional gate). If that is the case, then the electrical contact is moved to the functional gate structure according to the present disclosure. As an example, suppose the initial layout design has the dummy gate structure 150C and the functional gate structure 150B formed as a single gate structure, and an electrical contact 160 was to be formed on the dummy gate structure 150C based on the initial layout design. According to the present disclosure, the initial layout design is modified such that, not only is the dummy gate structure 150C physically separated from the functional gate structure 150B (i.e., by reconfiguring the existing layout design or by etching), but the electrical contact 160 is also "moved" so that it will be formed on the functional gate structure 150B. In that manner, the functional gate structure 150B can still gain electrical access with external devices, while the dummy gate structure 150C is still electrically isolated from other devices.

Although not completely illustrated in FIG. 2, it is understood that an interconnect structure is formed over the upper surface of the substrate 50 (and over the gate structures 150). The interconnect structure includes a plurality of patterned dielectric layers and interconnected conductive layers. These interconnected conductive layers provide interconnections (e.g., wiring) between circuitries, inputs/outputs, and various doped features formed in the substrate 50. In more detail, the interconnect structure may include a plurality of interconnect layers, also referred to as metal layers (e.g., M1, M2, M3, etc). Each of the interconnect layers includes a plurality of interconnect features, also referred to as metal lines. Examples of the metal lines are illustrated herein as metal lines 170. The metal lines 170 may be aluminum interconnect lines or copper interconnect lines, and may include conductive materials such as aluminum, copper, aluminum alloy, copper alloy, aluminum/silicon/copper alloy, titanium, titanium nitride, tantalum, tantalum nitride, tungsten, polysilicon, metal silicide, or combinations thereof. The metal lines 170 may be formed by a process including PVD, CVD, sputtering, plating, or combinations thereof.

The interconnect structure includes an interlayer dielectric (ILD) that provides isolation between the interconnect layers. The ILD may include a dielectric material such as an oxide material. The interconnect structure also includes a plurality of vias/contacts (e.g., such as the electrical contacts 160) that provide electrical connections between the different interconnect layers and/or the features on the substrate. In the following paragraphs, the processes used to form some of the metal layers and their interconnecting vias will be discussed in more detail.

Figure 3A:
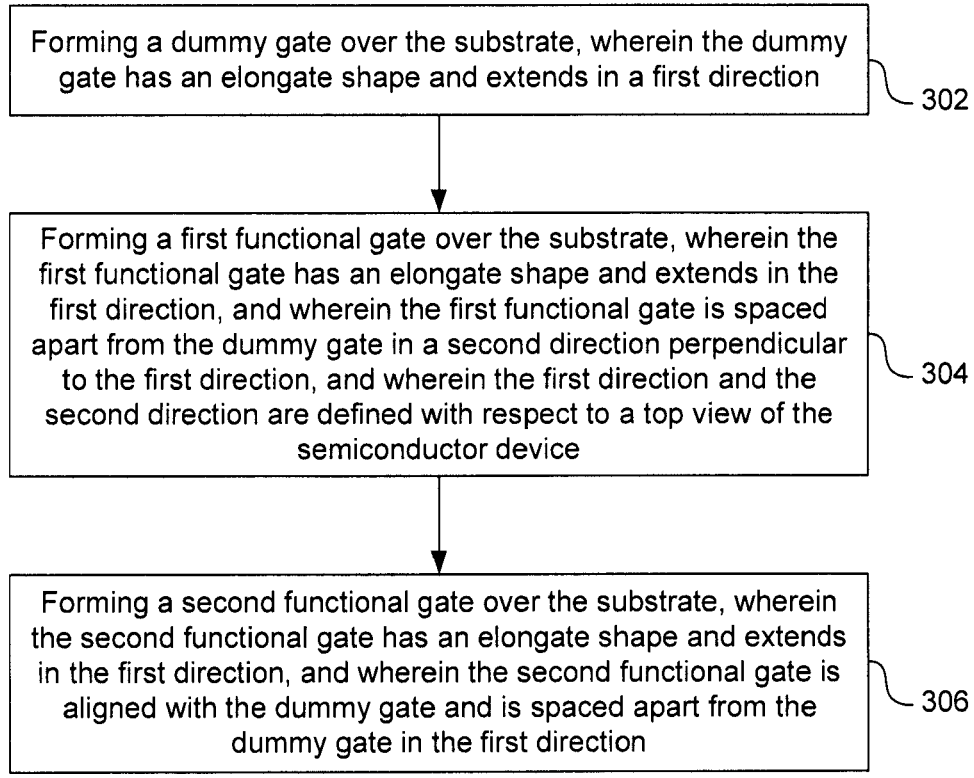
FIGS. 3A and 3B are flowcharts showing a method for forming a semiconductor device in accordance with various aspects of the present disclosure.

FIG. 3A is a flowchart showing a method for forming a semiconductor device. According to the present example, the method includes a step for forming 302 a dummy gate over the substrate, wherein the dummy gate has an elongate shape and extends in a first direction. The method further includes a step for forming 304 a first functional gate over the substrate, wherein the first functional gate has an elongate shape and extends in the first direction, and wherein the first functional gate is spaced apart from the dummy gate in a second direction perpendicular to the first direction, and wherein the first direction and the second direction are defined with respect to a top view of the semiconductor device. The method further includes a step for forming 306 a second functional gate over the substrate, wherein the second functional gate has an elongate shape and extends in the first direction, and wherein the second functional gate is aligned with the dummy gate and is spaced apart from the dummy gate in the first direction.

Figure 3B:
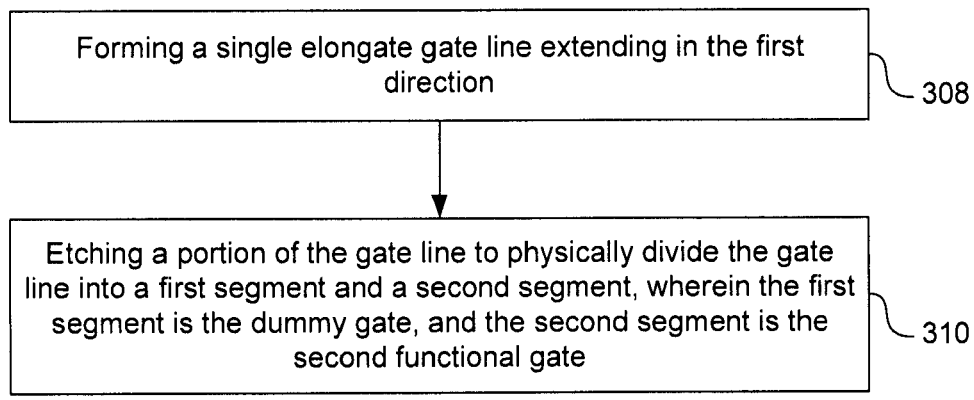

FIG. 3B is a flowchart showing a method for forming the second functional gate. According to the present example, the method for forming the second functional gate includes a step for forming 308 a single elongate gate line extending in the first direction. The method further includes a step for etching 310 a portion of the gate line to physically divide the gate line into a first segment and a second segment, wherein the first segment is the dummy gate, and the second segment is the second functional gate.

As discussed above, the embodiments of the present disclosure offers advantages, it being understood that different embodiments may offer different advantages, and not all the advantages are discussed herein, and that no particular advantage is required for all embodiments. One of the other advantages of certain embodiments of the present disclosure is that it forms an electrical-free dummy gate next to one or more functional gates. Since the dummy gate cannot be electrically charged, it cannot induce a breakdown path between itself and the nearby functional gate(s). In other words, a voltage applied to a functional gate is not passed on to the dummy gate, thereby making the dummy gate electrically isolated. In this manner, the likelihood of damage to the semiconductor device is reduced, and the semiconductor performance is improved. In some instances, the electrical-free dummy gate is formed by carefully configuring an initial layout to ensure that the dummy gate is physically separated from other functional gates. In other instances, the electrical-free dummy gate is formed by adjusting an initial layout design such so as to divide a single gate line containing both a functional gate portion and a dummy gate portion into two physically separate gates (one of them being the dummy gate). In that case, the placement of electrical contacts may also be adjusted to ensure that the electrical voltage is applied to the functional gate, rather than the dummy gate. In some other instances, an etching process or another suitable process may be used to physically separate a single gate line containing both the functional gate portion and the dummy gate portion into two physically separate gates. The various embodiments of the present disclosure is also advantageous in that it is compatible with existing process flow and thus does not raise fabrication costs to implement.

One of the broader forms of the present disclosure involves a semiconductor device. The semiconductor device includes: an elongate first gate extending in a first direction, the first gate being a dummy gate; an elongate second gate extending in the first direction, the second gate being spaced apart from the first gate in a second direction different from the first direction; and an elongate third gate extending in the first direction and being aligned with and spaced apart from the first gate in the first direction, the third gate having an electrical contact formed thereon.

In some embodiments, the first gate is an electrical-free dummy gate and has no electrical contacts formed thereon.

In some embodiments, the second gate has a further electrical contact formed thereon.

In some embodiments, the second gate and the third gate are non-dummy gates.

In some embodiments, the first direction and the second direction are perpendicular and together define a top view of the semiconductor device.

In some embodiments, the second gate and the third gate are each formed over a respective active region of a substrate; and the first gate is formed over a non-active region of a substrate.

In some embodiments, a source/drain region is disposed between the first gate and the second gate from a top view.

In some embodiments, a dielectric isolation region is disposed between the first gate and the third gate from a top view.

In some embodiments, the first gate, the second gate, and the third gate all contain substantially similar materials.

Another of the broader forms of the present disclosure involves a semiconductor device. The semiconductor device includes: an electrical-free dummy gate formed over a substrate, wherein the dummy gate has an elongate shape and is oriented along a first direction; a first functional gate formed over the substrate, wherein the first functional gate has an elongate shape and is oriented along the first direction, and wherein the first functional gate is separated from the dummy gate in a second direction perpendicular to the first direction; a first conductive contact formed on the first functional gate; a second functional gate formed over the substrate, wherein the second functional gate has an elongate shape and is oriented along the first direction, and wherein the second functional gate is aligned with the dummy gate and is physically separated from the dummy gate in the first direction; and a second conductive contact formed on the second functional gate.

In some embodiments, the dummy gate has no conductive contacts formed thereon.

In some embodiments, the first direction and the second direction are defined with respect to a top view of the semiconductor device.

In some embodiments, the substrate contains a doped portion and a dielectric isolation portion; the first functional gate and the second functional gate are formed over a part of the doped portion; and the dummy gate is formed over a part of the dielectric isolation portion.

In some embodiments, the doped portion contains a plurality of source/drain regions, and wherein one of the source/drain regions is located between the first functional gate and the dummy gate from a top view.

In some embodiments, the dummy gate, the first functional gate, and the second functional gate have substantially similar material compositions.

Still another of the broader forms of the present disclosure involves a method of fabricating a semiconductor device. The method includes: providing a substrate; forming a dummy gate over the substrate, wherein the dummy gate has an elongate shape and extends in a first direction; forming a first functional gate over the substrate, wherein the first functional gate has an elongate shape and extends in the first direction, and wherein the first functional gate is spaced apart from the dummy gate in a second direction perpendicular to the first direction, and wherein the first direction and the second direction are defined with respect to a top view of the semiconductor device; and forming a second functional gate over the substrate, wherein the second functional gate has an elongate shape and extends in the first direction, and wherein the second functional gate is aligned with the dummy gate and is spaced apart from the dummy gate in the first direction.

In some embodiments, the dummy gate, the first functional gate, and the second functional gate are all formed by the same fabrication processes.

In some embodiments, the dummy gate, the first functional gate, and the second functional gate are formed by different fabrication processes.

In some embodiments, the method further includes: forming a first electrical contact on the first functional gate; and forming a second electrical contact on the second functional gate; wherein no electrical contact is formed on the dummy gate.

In some embodiments, the forming the dummy gate and the forming the second functional gate comprise: forming a single elongate gate line extending in the first direction; and etching a portion of the gate line to physically divide the gate line into a first segment and a second segment; wherein the first segment is the dummy gate, and the second segment is the second functional gate.

In some embodiments, the dummy gate is formed over a dielectric isolation region of the substrate; and the first functional gate and the second functional gate are formed over an active region of the substrate.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, the high voltage device may not be limited to an NMOS device and can be extended to a PMOS device with a similar structure and configuration except that all doping types may be reversed and dimensions are modified according to PMOS design. Further, the PMOS device may be disposed in a deep n-well pocket for isolating the device.

What is claimed is:

1. A semiconductor device, comprising:
an elongate first gate extending in a first direction, the first gate being an electrical-free dummy gate;
an elongate second gate extending in the first direction, the second gate being spaced apart from the first gate in a second direction different from the first direction; and
an elongate third gate extending in the first direction and being aligned with and spaced apart from the first gate in the first direction, the third gate having an electrical contact formed thereon,
wherein a trench dielectric isolation region is disposed between the first gate and the third gate from a top view.

2. The semiconductor device of claim 1, wherein the first gate has no electrical contacts formed thereon.

3. The semiconductor device of claim 1, wherein the second gate has a further electrical contact formed thereon.

4. The semiconductor device of claim 1, wherein the second gate and the third gate are non-dummy gates.

5. The semiconductor device of claim 1, wherein the first direction and the second direction are perpendicular and together define a top view of the semiconductor device.

6. The semiconductor device of claim 1, wherein:
the second gate and the third gate are each formed over a respective active region of a substrate; and
the first gate is formed over a non-active region of a substrate.

7. The semiconductor device of claim 1, wherein a source/drain region is disposed between the first gate and the second gate from a top view.

8. The semiconductor device of claim 1, wherein the first gate, the second gate, and the third gate all contain substantially similar materials.

9. A semiconductor device, comprising:
an electrical-free dummy gate formed over a substrate, wherein the dummy gate has an elongate shape and is oriented along a first direction;
a first functional gate formed over the substrate, wherein the first functional gate has an elongate shape and is oriented along the first direction, and wherein the first functional gate is separated from the dummy gate in a second direction perpendicular to the first direction;
a first conductive contact formed on the first functional gate;
a second functional gate formed over the substrate, wherein the second functional gate has an elongate shape and is oriented along the first direction, and wherein the second functional gate is aligned with the dummy gate and is physically separated from the dummy gate in the first direction; and
a second conductive contact formed on the second functional gate,
wherein a trench dielectric isolation region is disposed between the first gate and the third gate from a top view.

10. The semiconductor device of claim 9, wherein the dummy gate has no conductive contacts formed thereon.

11. The semiconductor device of claim 9, wherein the first direction and the second direction are defined with respect to a top view of the semiconductor device.

12. The semiconductor device of claim 9, wherein:
the substrate contains a doped portion and a dielectric isolation portion;
the first functional gate and the second functional gate are formed over a part of the doped portion; and
the dummy gate is formed over a part of the dielectric isolation portion.

13. The semiconductor device of claim 12, wherein the doped portion contains a plurality of source/drain regions, and wherein one of the source/drain regions is located between the first functional gate and the dummy gate from a top view.

14. The semiconductor device of claim 9, wherein the dummy gate, the first functional gate, and the second functional gate have substantially similar material compositions.

15. A method of fabricating a semiconductor device, comprising:
providing a substrate;
forming a dummy gate over the substrate, wherein the dummy gate has an elongate shape and extends in a first direction;
forming a first functional gate over the substrate, wherein the first functional gate has an elongate shape and extends in the first direction, and wherein the first functional gate is spaced apart from the dummy gate in a second direction perpendicular to the first direction, and wherein the first direction and the second direction are defined with respect to a top view of the semiconductor device; and
forming a second functional gate over the substrate, wherein the second functional gate has an elongate shape and extends in the first direction, and wherein the second functional gate is aligned with the dummy gate and is spaced apart from the dummy gate in the first direction,
wherein a trench dielectric isolation region is disposed between the first gate and the third gate from a top view.

16. The method of claim 15, wherein the dummy gate, the first functional gate, and the second functional gate are all formed at the same time by the same fabrication processes.

17. The method of claim 15, further comprising:
forming a first electrical contact on the first functional gate; and
forming a second electrical contact on the second functional gate;
wherein no electrical contact is formed on the dummy gate.

18. The method of claim 15, wherein the forming the dummy gate and the forming the second functional gate comprise:
forming a single elongate gate line extending in the first direction; and
etching a portion of the gate line to physically divide the gate line into a first segment and a second segment;
wherein the first segment is the dummy gate, and the second segment is the second functional gate.

19. The method of claim 15, wherein:
the dummy gate is formed over a dielectric isolation region of the substrate; and
the first functional gate and the second functional gate are formed over an active region of the substrate.

* * * * *